(12) United States Patent
Kozawa

(10) Patent No.: US 7,279,948 B2
(45) Date of Patent: Oct. 9, 2007

(54) SCHMIDT TRIGGER CIRCUIT HAVING SENSITIVITY ADJUSTING FUNCTION AND SEMICONDUCTOR DEVICE INCLUDING THE SAME

(75) Inventor: Yukio Kozawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 101 days.

(21) Appl. No.: 11/326,288

(22) Filed: Jan. 6, 2006

(65) Prior Publication Data

US 2006/0158236 A1 Jul. 20, 2006

(30) Foreign Application Priority Data

Jan. 14, 2005 (JP) ............................. 2005-008310

(51) Int. Cl.
*H03K 3/00* (2006.01)
(52) U.S. Cl. .................... 327/205; 327/199; 326/83
(58) Field of Classification Search ............ 326/82–86, 326/37, 38, 26, 27; 327/199, 205
See application file for complete search history.

(56) References Cited

U.S. PATENT DOCUMENTS 6,084,456 A * 7/2000 Seol ...................... 327/206

6,433,615 B2 * 8/2002 Nagano et al. ............. 327/513

FOREIGN PATENT DOCUMENTS

| JP | 2-105715 | 4/1990 |
|----|----------|--------|
| JP | 10-163826 | 6/1998 |

* cited by examiner

*Primary Examiner*—Don Le
(74) *Attorney, Agent, or Firm*—Foley & Lardner LLP

(57) ABSTRACT

To maintain the noise removal characteristic of a Schmidt trigger circuit stably. There are provided a Schmidt trigger circuit 10 constituted from a Vp/Vn setting unit 11 for determining the threshold level of an input signal and an RS latch unit 12, a driver unit 13 having a low-pass filter function of passing a pulse signal with a predetermined width or more, output from the Schmidt trigger circuit 10, and an operating current setting and sensor unit 14 for changing a supply voltage and supplying the changed supply voltage to an inverter INV4 having the low-pass filter function so that the inverter INV4 changes the width of a pulse to be passed through. The operating current setting and sensor unit 14 includes a sensor circuit 16 having a P-ch transistor MP2 and an N-ch transistor MN2 that are connected in series for setting the supply voltage. The inverter INV4 is constituted from a P-ch transistor MP1 that has the same shape as the P-ch transistor MP2 and an N-ch transistor MN1 that has the same shape as the N-ch transistor MN2.

9 Claims, 5 Drawing Sheets

SCHMIDT TRIGGER CIRCUIT HAVING SENSITIVITY ADJUSTING FUNCTION AND SEMICONDUCTOR DEVICE INCLUDING THE SAME

FIELD OF THE INVENTION

The present invention relates to a Schmidt Trigger circuit having a sensitivity adjusting function and a semiconductor device including the same.

BACKGROUND OF THE INVENTION

Schmidt trigger circuits are the circuits for performing waveform shaping so that a signal that changes in an analog manner can be handled as a digital signal, and are used for preventing occurrence of chattering at a voltage in the vicinity of a threshold voltage thereof, thereby supplying a stable output signal to other circuit. An example of the Schmidt trigger circuits described above is described in Patent Document 1. The Schmidt trigger circuit described in Patent Document 1 includes two inverters having different thresholds, of which input terminals are connected in common, a logic circuit for inverting or noninverting the output signals of these inverters, and a latch circuit for obtaining output signals with levels thereof changed according to the logic output signals of this logic circuit.

FIG. 4 is a circuit diagram showing a configuration of a conventional Schmidt trigger circuit. The Schmidt trigger circuit in FIG. 4 is the circuit comparable to the Schmidt trigger circuit described in Patent Document 1. A driver circuit 103 for performing output from a Schmidt trigger circuit 100 to other circuit is further added. The Schmidt trigger circuit 100 in FIG. 4 includes a Vp/Vn setting unit 101 and an RS latch circuit 102. An input terminal IN for inputting a signal from outside is connected to inputs of inverters INV11 and INV12 in the Vp/Vn setting unit 101. The Vp/Vn setting unit 101 is constituted from the inverter INV11 for determining a positive trigger voltage level Vp, the inverter INV12 for determining a negative trigger voltage level Vn, and an inverter INV13 for inverting the output signal of the inverter INV12. Outputs of the inverters INV11 and INV13 are connected to inputs of the RS latch unit 102 in a subsequent stage, respectively. The RS latch unit 102 is constituted from NAND gates NAND11 and NAND12 of which one inputs are cross-coupled to outputs of the NAND gates NAND12 and NAND11, respectively. The other input of the NAND gate NAND11 that is not cross-coupled is connected to the output of the inverter INV11, and the other input of the NAND gate NAND12 that is not cross-coupled is connected to the output of the inverter INV13. The output of the NAND gate NAND11 is connected to the driver unit 103 in a subsequent stage. In the driver unit 103, an inverter INV14 and INV15 are connected in series. The driver unit 103 buffers and transmits a signal output from the NAND gate NAND11 to an output terminal OUT within an integrated circuit.

The positive trigger voltage Vp is the input threshold level of the inverter INV11, while the negative trigger voltage Vn is the input threshold level of the inverter INV12. Between both of the voltage levels, there is a relationship of Vp>Vn, so that a level difference (Vp−Vn) corresponds to a so-called hysteresis width.

Next, operations of units when a signal S101 applied to the input terminal IN rises slowly will be described. First, when the signal S101 at the input terminal IN exceeds the Vn level, the inverter INV12 is inverted, and the inverter INV13 is inverted next. The level of a signal S102 thereby transitions from a low level (L) to a high level (H). Then, when the signal S101 exceeds the Vp level, the inverter INV11 is inverted. A signal S103 thereby transitions from the H to the L.

A signal S104 from the RS latch unit 102 has been fixed in an L state, and a signal S105 has been fixed in an H state, before that. The logic level of the signal S104 is the negative (inverted) logical product of the logic level of the signal S103 and the logic level of the signal S105. Thus, the transition of the signal S103 from the H to the L causes transition of the signal S104 from the L to the H. On the other hand, the logic level of the signal S105 is the negative logical product of the logic level of the signal S102 and the logic level of the signal S104. Thus, the transition of the signal S104 from the L to the H causes transition of the signal S105 from the to H the L. When the state of the signal S104 is noted, though the level of the signal S101 temporarily falls down and the signal S103 returns from the L to the H, the level of the signal S104 does not change because the signal S105 is at the L. This state is referred to as being "latched". This state is maintained unless the level of the signal S101 becomes the Vn or less and the signal S102 is then inverted.

A signal S106 of the output terminal OUT outputs (drives) the level of the signal S104 without alteration. As seen from the side of the output terminal, once the level of the signal S101 at the input terminal rises from the low level to become the positive trigger voltage Vp or higher, the signal S106 at the output terminal OUT is inverted from the L to the H. Thereafter, until the level of the signal S101 has become the negative trigger voltage Vn or lower, the signal S106 will not be inverted from the H to the L. With the operations as described above, even when the signal S101 at the input terminal IN has slowly risen, occurrence of chattering in the output signal can be prevented.

The above description is directed to the operations when the signal S101 at the input terminal IN has slowly risen. Conversely, even when the signal S101 has slowly fallen, the H/L levels of the respective units transition almost in reverse. Thus, once the level of the signal S101 has become the negative trigger voltage Vn or less, the signal S106 of the output terminal OUT is inverted from the H to the L. Thereafter, until the level of the signal S101 has become the positive trigger voltage Vp or higher, the signal S106 of the output OUT is not inverted from the L to the H.

Patent Document 2 discloses a Schmidt trigger circuit of an inverter type.

[Patent Document 1]
JP Patent Kokai Publication No. JP-A-2-105715 (FIG. 1)
[Patent Document 2]
JP Patent Kokai Publication No. JP-A-10-163826 (FIG. 5)

SUMMARY OF THE DISCLOSURE

With a higher speed of semiconductor integrated devices and an increase in the difference of internal logic levels due to multiple power supplies in the semiconductor integrated devices, there is found a timing of a malfunction that occurs because a hysteresis operation caused by a latch mechanism as described before does not work well. This phenomenon will be described below.

FIG. 5 is a timing diagram that explains an operation when a short pulse signal (noise) is applied to the conventional Schmidt trigger circuit of a latch type shown in FIG. 4. There is shown a case where a noise N and a noise W are superimposed on the waveform of the input signal S101 that slowly rises from a level of the negative trigger voltage Vn or lower to a level of the positive trigger voltage Vp or higher, at different timings.

First, when the signal S101 at the input terminal IN reaches the negative trigger voltage Vn, the signal S102 transitions from the L to the H through the inverters INV12 and INV13. Then, assume that the noise N is superimposed when the signal S101 has risen to a midway point between the negative trigger voltage Vn and the positive trigger voltage Vp, and the signal S101 has exceeded the positive trigger voltage Vp during a short period. Then, the signal S103 transitions from the H to the L through the inverter INV11, and further, the signal S104 also transitions from the L to the H through the NAND gate NAND11. In a normal case, the signal S105 transitions from the H to the L through the NAND gate NAND12 due to transition of the signal S104 and reaches the input terminal of the NAND gate NAND11. The signal S104 is thereby "latched". However, the period during which the signal S101 becomes the voltage level Vp or higher is short. Thus, when the signal S103 immediately returns to the H and the signal S104 also returns to the L, the signal S105 returns to the H without reaching the L from the H. In other words, in the case of the waveform (of the noise N) where the period during which the input signal S101 becomes the voltage Vp or higher is shorter than a latch time T1 required for propagation from the signal S103 to signal S104, and further to the signal S105 whereby and the signal S104 is "latched", latching will fail.

However, the signal S104 at this point is propagated to the driver unit 103 in the subsequent stage as well. In the conventional semiconductor integrated device of which the operation was comparatively slow and in which the internal logic levels are the same, input sensitivities and response speeds of the NAND gate NAND12 and the inverter INV14 were the same. When propagation from the signal S104 to the signal S105 was not performed, the possibility of propagation from the signal S104 to the signal S106 was extremely low. However, due to the higher speed of the integrated circuit and the increase in the difference between the internal logic levels in the integrated circuit caused by the multiple power supplies in recent years, even if the signal S104 is a short pulse that would not cause the NAND gate NAND12 to perform an inverting operation, the inverter INV14 may have a sensitivity and speed that perform an inverting operation by the signal S104, which may cause transition of the output signal S106 from the L to the H. In this case, the signal S104 is returned to the L, thereby causing transition of the signal S106 from the L to the H in a short time.

More specifically, when a signal such as the noise N that crosses the Vp level during a short period (shorter than the time T1) has been applied, the output signal S106 is inverted from the L to the H because the signal has once exceeded the Vp level, as seen from the side of the output terminal OUT. Then, even if the input signal S101 does not become the Vn or less, the output signal S106 is returned to the L from the H, which means that the Schmidt trigger circuit has malfunctioned.

When such a malfunction would occur, the following problem will arise. In case where the Schmidt trigger circuit has a counter circuit in a subsequent stage thereof and the counter circuit counts the number of pulses, count of one is performed due to this noise N. Next, when the signal has passed through the Vp in the form of an inherent gentle waveform of a gradual increase, a count of one is again performed due to a normal operation. Accordingly, a total count of two is obtained. That is, the number of pulses that should inherently be one is erroneously counted as two, so that the original intention to accurately count the number of pulses using the Schmidt circuit would not be achieved. As one of the examples of the counter circuit, there is an application with the pulse frequency widely ranging from several Hz to several hundred KHz, such as a simple counting device, a rotation meter for measuring a motor speed, an angle sensor for tracing the direction of an object. In such a case as well, the malfunction in regard to counting due to the noise will become the problem.

Incidentally, when a noise such as the noise W has been superimposed at a timing at which the Vp level is crossed for a long period of time (exceeding the time T1), the output signal S106 does not return to the L from the H unless the level of the input signal S101 becomes the Vn or less. This corresponds to a normal operation as the Schmidt trigger circuit. In this case, even if a pulse count of one is performed for this noise W, the counting is continuous with counting using the inherent waveform Vp. Since the pulse count is strictly one as in the normal case. Thus, no problem arises even in the application for counting as described before or the like.

The malfunction of the Schmidt trigger circuit as described above may occur by the same mechanism even when the noise is superimposed at the time of fall of the input signal S101.

In order to prevent the malfunction caused by such a noise with a short width, there may be conceived a method of providing a delay circuit or a buffer having a low response speed between the RS latch unit 102 and the driver unit 103 or in the driver unit 103, thereby removing the pulse with the pulse width T1 or less. However, as smaller geometries and the lower voltage of the integrated circuit in the manufacturing process of the integrated circuit are pursued, it has become difficult to manufacture the circuit with a good accuracy and a stable frequency characteristic. In the case of an ASIC (Application Specific Integrated Circuit), a noise environment and power supply stability differ according to the application by a user. Thus, there has arisen the need for modifying the sensitivity of a filter (or the response speed of the buffer) according to an actual operation. Accordingly there is much to be desired in the art.

In order to solve the problem described above, the inventor of the present invention has conceived provision of a buffer capable of adjusting the response speed thereof outside the Schmidt trigger circuit and mounting of a sensor circuit having the same variations in the manufacturing process, the same temperature characteristic, and the same voltage characteristic as the buffer within the same chip. Then, according to the application of an input circuit, the circuit is made to have the function of setting the response speed of the buffer as necessary, and it is so arranged that by referring to the status of the sensor circuit, set value variations due to the variations in the manufacturing process, temperature variations, and voltage variations can be corrected one after another.

A Schmidt trigger circuit having a sensitivity arrangement function according to one aspect of the present invention comprises a Schmidt trigger circuit and a buffer circuit having a low-pass filter function of passing a pulse signal having a predetermined width or more, output from the Schmidt trigger circuit. The predetermined width is set outside the buffer circuit according to the volt-current characteristics of transistors constituting the buffer circuit.

The meritorious effects of the present invention are summarized as follows. According to the present invention, a noise removal characteristic when superimposition of a pulse signal (noise) with a short width is performed in the Schmidt trigger circuit can be maintained stably, without depending on supply voltage variations and the variations in the manufacturing process.

PREFERRED EMBODIMENTS OF THE INVENTION

A Schmidt trigger circuit with a sensitivity adjusting function according to an embodiment mode of the present invention includes a driver circuit having a low-pass filter function in an inside thereof so as not to response to a pulse signal having a short width superimposed on an input signal. The driver circuit is implemented by a buffer that can perform speed adjustment of the low-pass filter function, and can perform speed setting inside or outside a semiconductor device. In such a driver circuit, with respect variations of the speed of the included buffer, an adjusting function for performing compensation to maintain a set value is controlled. The variations of the speed of the included buffer are caused by variations in the operating temperature or the operating voltage of the semiconductor device or variations in the manufacturing process of the semiconductor device. Further, the characteristic of removing a short-pulse signal is controlled by the sensor circuit. This sensor circuit is constituted by transistors each having the same shape and the same volt-current characteristic as a corresponding one of transistors constituting the circuit of the buffer to which the speed adjustment is made. A detailed description will be given in conjunction with embodiments, with reference to drawings.

First Embodiment

Figure 1:
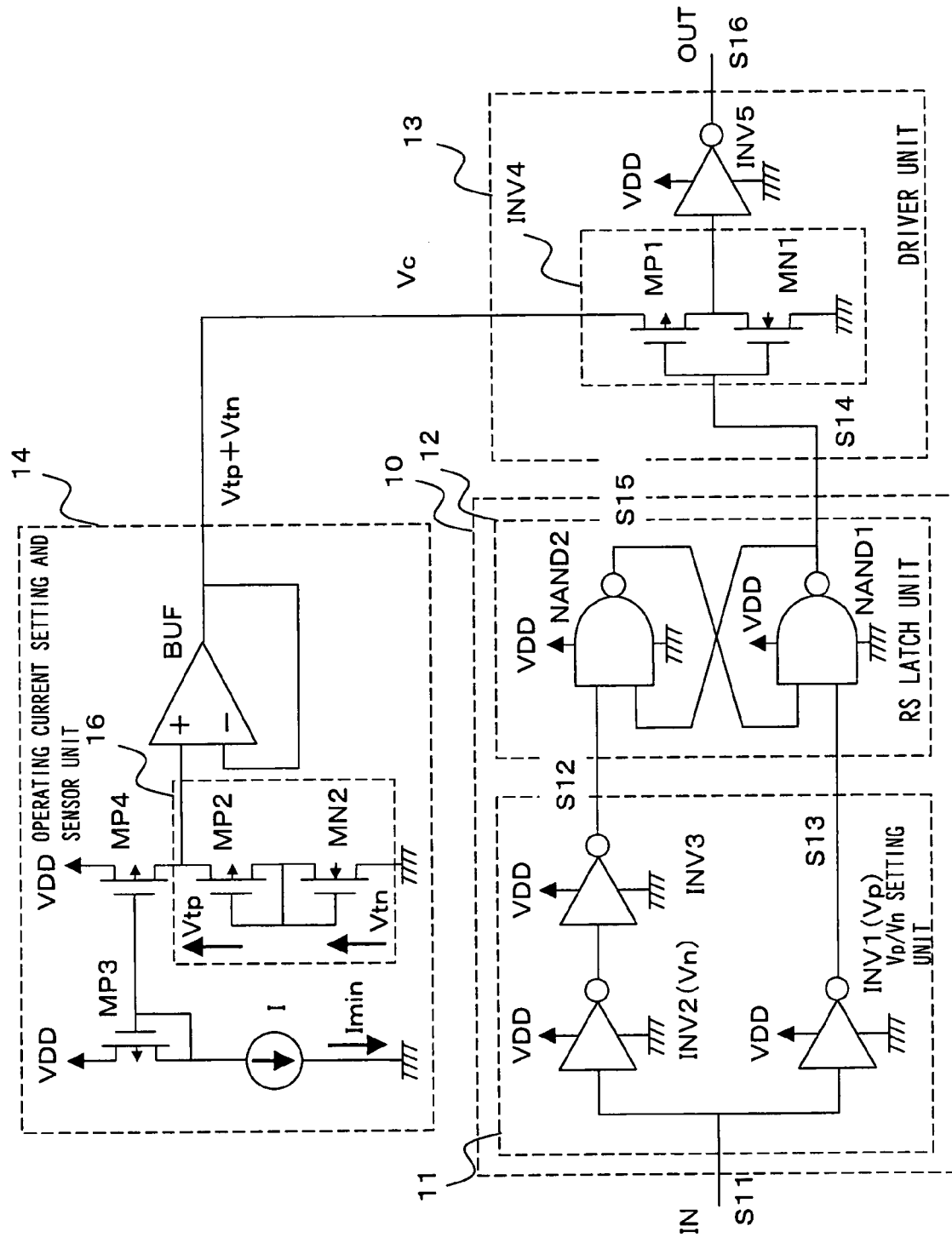
FIG. 1 is a circuit diagram showing a configuration of a Schmidt trigger circuit having a sensitivity adjusting function according to a first embodiment of the present invention.
Figure 4:
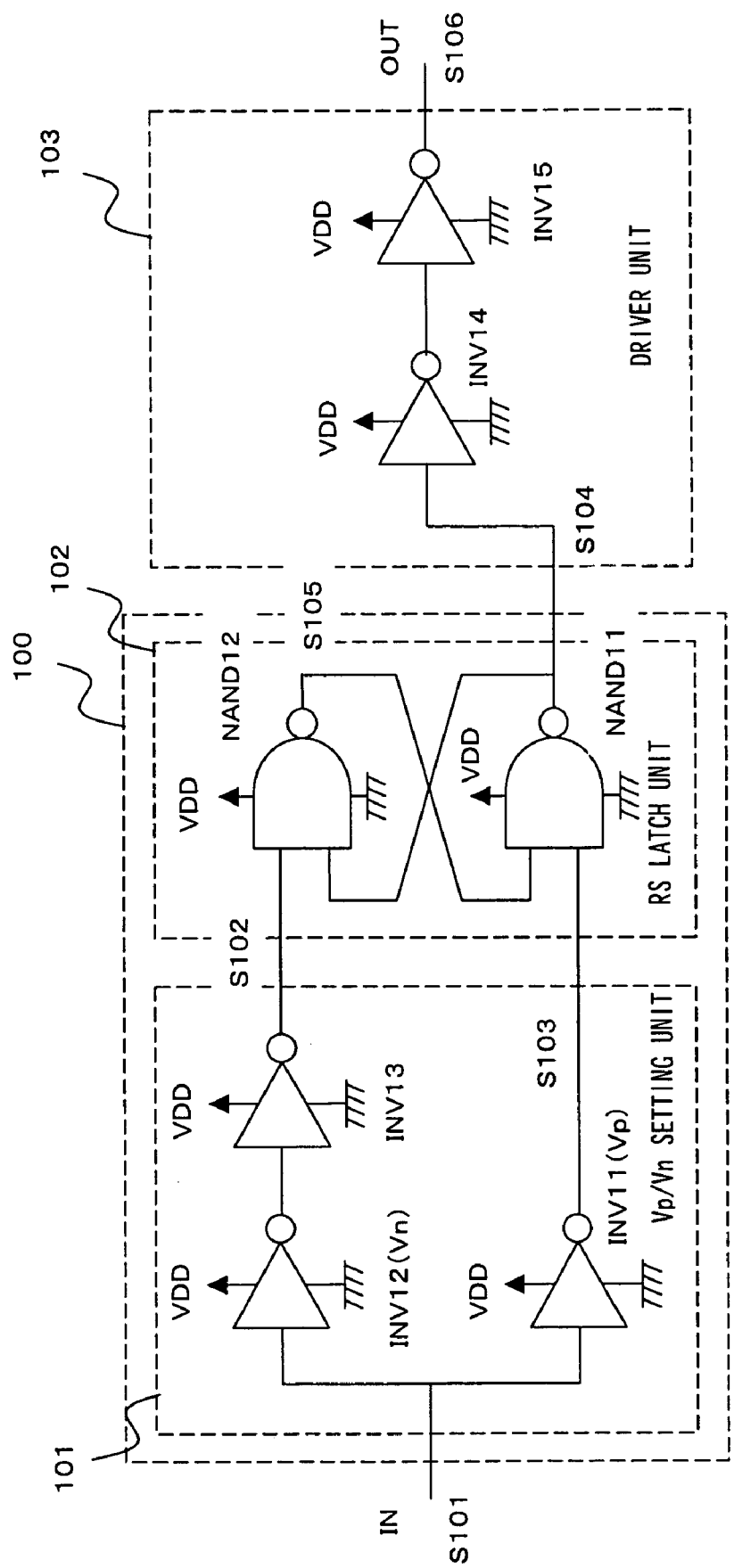
FIG. 4 is a circuit diagram showing a configuration of a conventional Schmidt trigger circuit.

FIG. 1 is a circuit diagram showing a configuration of a Schmidt trigger circuit having a sensitivity adjusting function according to a first embodiment of the present invention. The Schmidt trigger circuit having the sensitivity adjusting function includes a Schmidt trigger circuit 10, a driver unit 13, and an operating current setting and sensor unit 14. The Schmidt trigger circuit 10 includes a Vp/Vn setting unit 11 and an RS latch unit 12. Since the Vp/Vn setting unit 11 and the RS latch unit 12 have the same structures as those of a Vp/Vn setting unit 101 and an RS latch unit 102 in FIG. 4, respectively, their descriptions will be omitted. An inverter INV4 in the first stage of the driver unit 13 is configured to supply power using a control voltage Vc from the outside of the driver unit 13. An inverter INV5 in its subsequent stage has the same configuration as an inverter INV15 in FIG. 4 and is connected to a fixed voltage power supply VDD. The output of the inverter INV5 is connected to an output terminal OUT.

On the other hand, together with the driver unit 13, the operating current setting and sensor unit 14 is provided within the same chip. The operating current setting and sensor unit 14 includes a constant current source I, P-ch transistors MP2, MP3, and MP4, an N-ch transistor MN2, and an operational amplifier BUF. The constant current source I sets an operating current for the inverter INV4, and its constant current value Imin can be set freely according to a response speed required for the inverter INV4. Incidentally, the constant current source I may be installed inside or outside an integrated circuit. Further, if the constant current source I is used for an application that does not require its accuracy so much, the constant current source I can be substituted for by a resistance. The transistors MP3 and MP4 constitute a current mirror which passes the same current value as the value of the constant current Imin through the sensor circuit 16. The sensor circuit 16 is constituted from the P-ch transistor MP2 and the N-ch transistor MN2 connected in series. The gate of each of the transistors is coupled to the drain thereof and is inserted between the drain of the transistor MP4 of the current mirror and a GND. The shape and the arrangement direction of the P-ch transistor MP2 on the integrated circuit are made to the same as those of the P-ch transistor MP1 that constitutes the inverter INV4 so that they have the same characteristics, and they are arranged on the chip in locations close to each other. The shape and the arrangement direction of the N-ch transistor MN2 on the integrated circuit are made to be the same as those of the N-ch transistor MN1 that constitutes the inverter INV4 so that they have the same characteristics, and they are arranged on the chip in locations close to each other. Assume that the gate-to-source voltages of the P-ch transistor MP2 and the N-ch transistor MN2 when the constant current Imin has flown are set to a threshold voltage Vtp and a threshold voltage Vtn, respectively. Then, a sum voltage (Vtp+Vtn) of them is supplied to the driver unit 13 as a control voltage Vc by a voltage follower constituted from the operational amplifier BUF.

In order to lower the operating speed of the inverter INV4, the current value Imin of the constant current source is set to be small. The current value Imin is injected into the sensor circuit 16 through the current mirror circuit, thereby being converted to the voltage (Vtp+Vtn)=Vc. The control voltage Vc becomes smaller than the normal supply voltage VDD. The operating speed of the inverter INV4 can be thereby set to be slower (or the sensitivity of the inverter INV4 can be set to be lower). In other words, the low-pass filter function of the inverter INV4 of passing the pulse signal works stronger and the inverter INV4 operates to remove noise with a wider pulse width.

When the threshold voltages Vtp and Vtn vary due to the variations in the manufacturing process and the temperature variations, the operating speed of a normal inverter for which the supply voltage is constant will vary. The operating speed of the inverter INV4 to which the present invention has been applied, however, scarcely varies. When the threshold voltages Vtp and Vtn are reduced, for example, the speed of the inverter normally becomes faster. However, the voltage (Vtp+Vtn) of the sensor circuit 16 is also decrease. The control voltage Vc is also reduced, which functions to suppress an increase in the speed of the inverter INV4. On the contrary, when the threshold voltages Vtp and Vtn are increased, the speed of the inverter is normally reduced, whereas the voltage (Vtp+Vtn) of the sensor circuit 16 is also increased, resulting in increase of the control voltage Vc. This functions to suppress a reduction in the speed of the inverter INV4.

Figure 2:
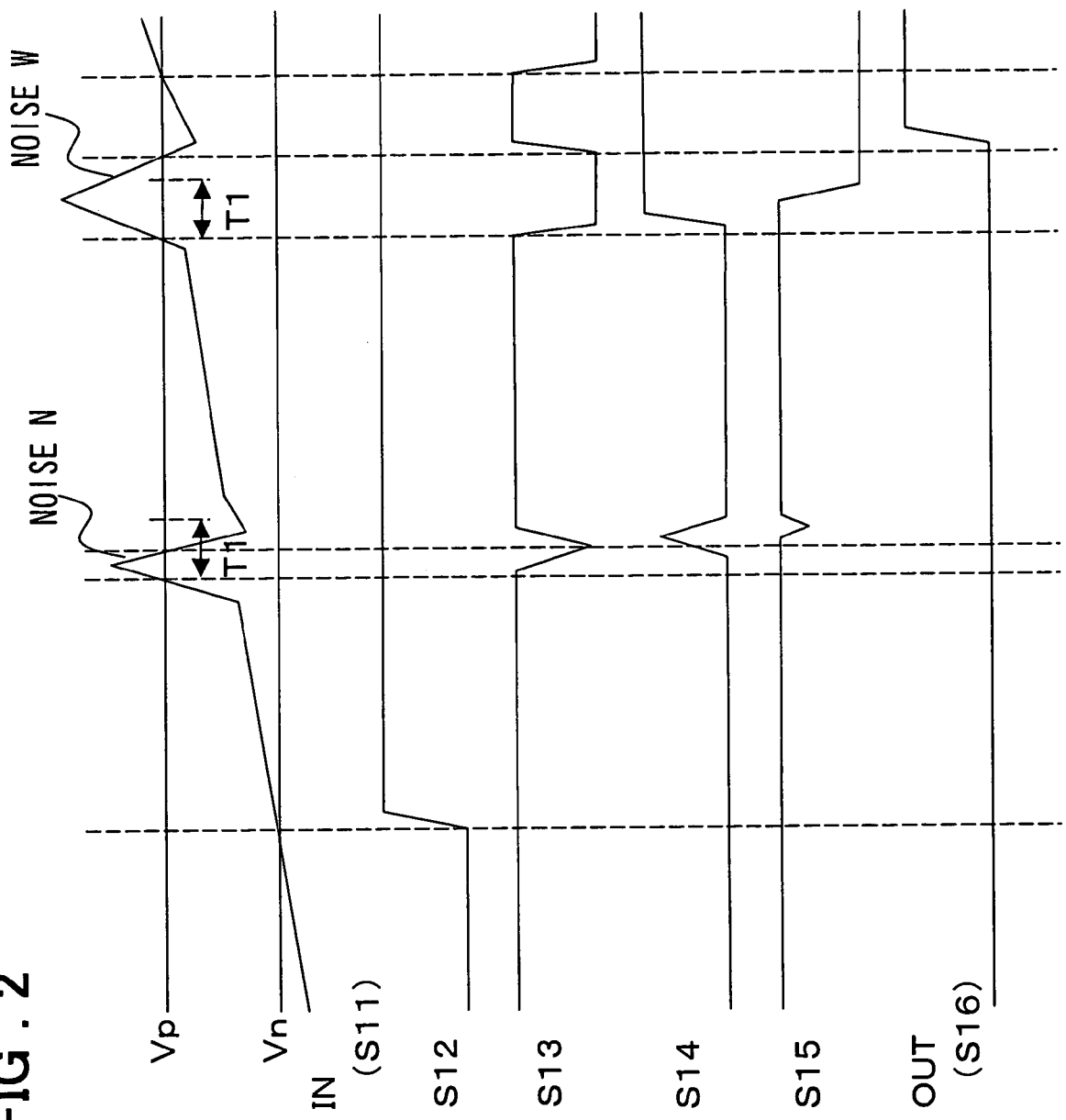
FIG. 2 is a diagram showing a timing chart of signals in the Schmidt trigger circuit having the sensitivity adjusting function according to the first embodiment of the present invention.
Figure 5:
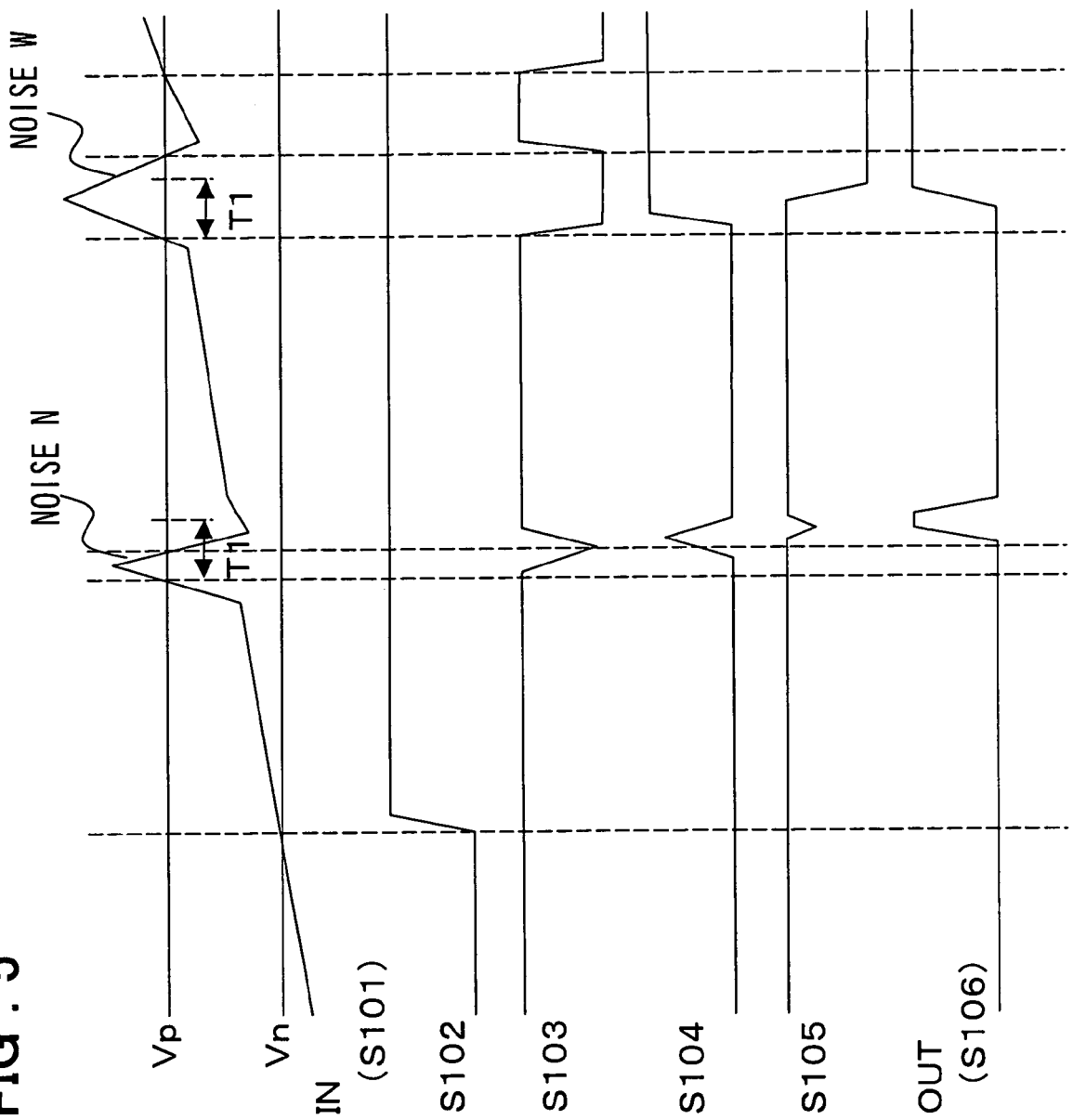
FIG. 5 is a diagram showing a timing chart of signals in the conventional Schmidt trigger circuit, as analyzed by the present invention.

FIG. 2 is a signal timing diagram when the short pulse signal (noise) is applied to an input circuit to which the present invention shown in FIG. 1 has been applied. The operating speed of the inverter INV4 is set to be slow so that the inverter INV4 does not respond to a short-duration (approximately less than a latch time T1) input pulse. When a signal S11 with two noises superimposed thereon is applied to an input terminal IN, an internal signal S12 has the same waveform as the S102 in FIG. 5. An internal signal S13 has the same waveform as the S103 in FIG. 5. An internal signal S14 has the same waveform as the S104 in FIG. 5. An internal signal S15 has the same waveform as the S105 in FIG. 5. The operating speed (sensitivity) of the inverter INV4 is, however, reduced. Thus, being different from the S106 in FIG. 5, the short pulse at NOISE N is removed from the signal S16. As seen from the output terminal OUT, a malfunction due to a first noise N having a small width is eliminated.

As a result, when the Schmidt trigger circuit having the sensitivity adjusting function according to the first embodiment is provided in a stage prior to a circuit for counting the number of pulses, noise is not counted as the number of the pulses though in a conventional circuit, an increase in counts was caused by the noise. Thus, there also arises an effect that accurate counting of the number of pulses can be achieved.

Incidentally, as an actual problem, how the latch time (T1) or the width of sensitivity adjustment is defined becomes the problem. Theoretically, the latch time becomes the minimum pulse width for causing the Schmidt trigger circuit to perform a hysteresis operation. One of the methods of defining this time is to add the request of an actual circuit to be used or the counter circuit described before or the like, for example, for selection, to perform checking, and to perform verification. It is also preferred that simulation or the like may be performed, thereby defining this width.

The sensitivity (operating speed) of the inverter INV4 depends on an operating current thereof. The operating current can be controlled by the control voltage Vc. A relationship between the operating current and the control voltage varies according to the manufacturing process and temperature. Thus, correction of the operating current needs to be performed. By reducing the operating speed of the inverter INV4 to a moderate degree so that the inverter INV4 does not respond to the short pulse superimposed on the signal S14 from the RS latch unit 12 to prevent the Schmidt trigger circuit from malfunctioning, and by supplying the control voltage Vc in which characteristic variations due to the manufacturing process and the temperature have been corrected by the sensor within the chip, stable characteristics that will not be affected even by the overall supply voltage VDD can be realized.

Further, when the upper limit of the response speed of the inverter INV4 is set to the latch time T1, the response speed can be freely adjusted according to the speed required for discriminating the signal actually applied to the Schmidt trigger circuit. Accordingly, not only the malfunction of the Schmidt trigger circuit can be eliminated, but also the noise filter characteristic that is effective for an actual operation signal can be obtained.

In the above description, there was shown an example where one driver unit 13 is provided for the operating current setting and sensor unit 14. It goes without saying that when an application is employed in which a characteristic error on the chip between the operating current setting and sensor unit 14 and the driver unit 13 does not become a problem in use, a plurality of driver units 13 located separated to one another on the chip may be provided, and that the control voltage Vc may be supplied from one operating current setting and sensor unit to each of the driver units 13.

Second Embodiment

Figure 3:
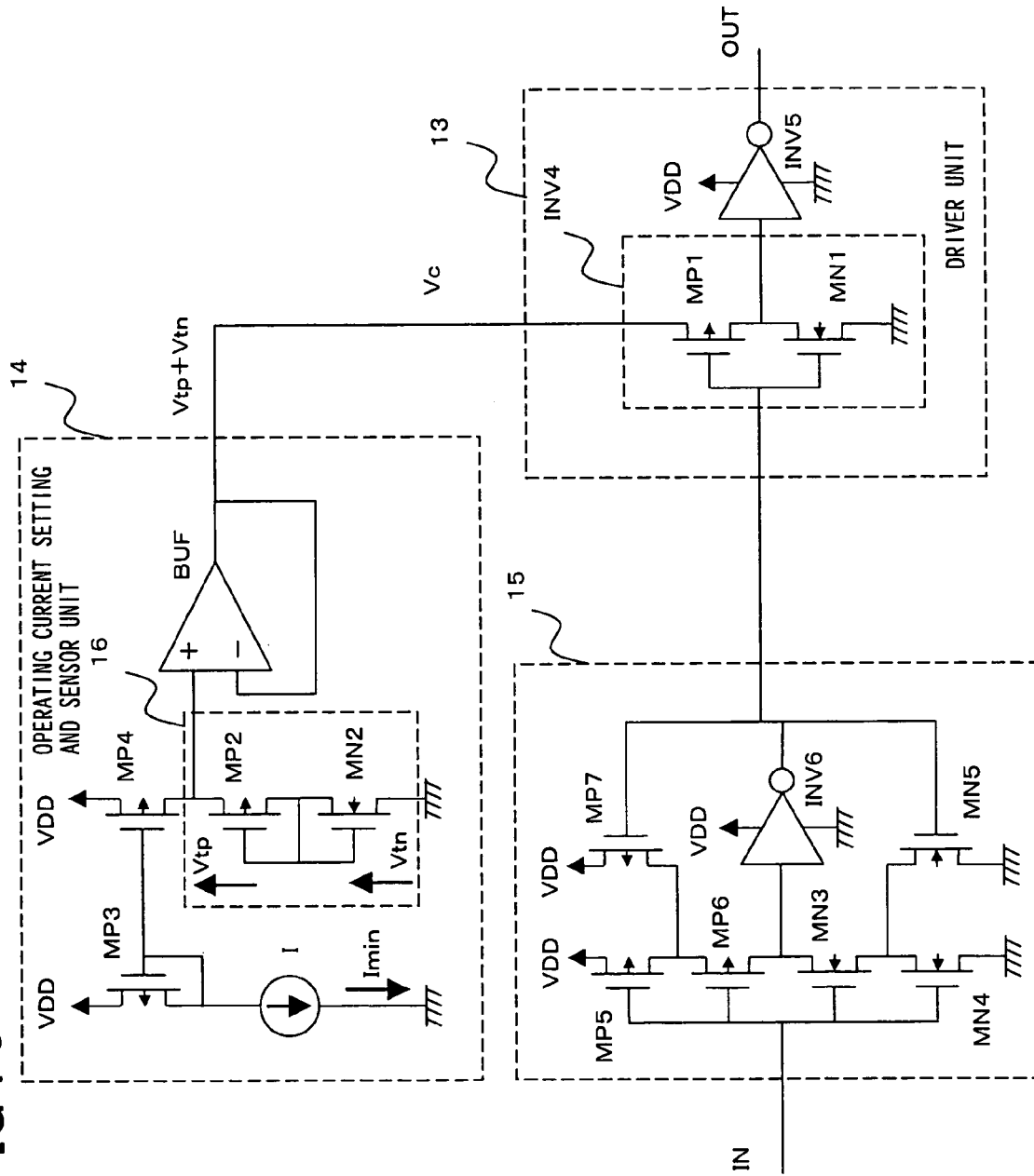
FIG. 3 is a circuit diagram showing a configuration of a Schmidt trigger circuit having a sensitivity adjusting function according to a second embodiment of the present invention.

FIG. 3 is a circuit diagram showing a configuration of a Schmidt trigger circuit having a sensitivity adjusting function according to a second embodiment of the present invention and shows a circuit example in which the present invention has been applied to the Schmidt trigger circuit of the inverter type as shown in Patent Document 2. Referring to FIG. 3, the driver unit 13 and the operating current setting and sensor unit 14 are the same as those in FIG. 1. Thus, their descriptions will be omitted. In the Schmidt trigger circuit 10 in FIG. 1, the positive trigger voltage Vp and the negative trigger voltage Vn are set in separate inverters, and transition signals from the respective inverters switch the state of an RS latch in a subsequent stage, thereby implementing a hysteresis characteristic. In a Schmidt trigger circuit 15 of the inverter type, an input threshold hold level is displaced according to the H/L level of the output state of the inverter in the first stage, thereby implementing the hysteresis characteristic. Its configuration and operation will be described below.

The inverter of the Schmidt trigger circuit 15 in the first stage is mainly constituted from a P-ch transistor MP6 and an N-ch transistor MN3. Further, the source of a P-ch transistor MP5 is connected to the VDD and the drain of the P-ch transistor MP5 is connected to the source of the P-ch transistor MP6. Further, the source and the drain of a P-ch transistor MP7 are connected in parallel with the P-ch transistor MP5, respectively. The source of an N-ch transistor MN4 is connected to the GND, and the drain of the N-ch transistor MN4 is connected to the source of the N-ch transistor MN3. Further, the source and the drain of an N-ch transistor MN5 are connected in parallel with the N-ch transistor MN4, respectively. The gates of the P-ch transistors MP5 and MP6 and the N-ch transistors MN3 and MN4 are made to be common and are connected to the input terminal IN. On the other hand, the drains of the P-ch transistor MP6 and the N-ch transistor MN3 are connected to the input of the inverter INV6. The output of the inverter INV6 is connected to the input of the inverter INV4, and is also connected to the gates of the P-ch transistor MP7 and the N-ch transistor MN5.

When the level of a signal at the input terminal IN is the L, the P-ch transistors MP5 and MP6 are turned on, and the N-ch transistors MN3 and MN4 are turned off. Accordingly, the level of an input to the inverter INV6 becomes the H, and the level of the output of the inverter INV6 becomes the L. The P-ch transistor MP7 with the gate thereof connected to the output of the inverter INV6 is turned on, and the N-ch transistor MN5 is turned off. The input threshold level of the inverter in the initial stage is determined by a ratio between the total sum of P-ch transistor on resistances and the total sum of N-ch transistor on resistances. Thus, in the state (in which the transistor MP7 is turned on, while the transistor MN5 is turned off) described above, the input threshold level becomes a higher level (equal to the Vp). On the other hand, when the level of the signal at the input terminal IN is the H, the on/off state of each of the transistors is inverted. Accordingly, the input threshold level becomes a lower level (equal to the Vn).

In other words, when the level of the input terminal IN transitions from the L to the H, its threshold level becomes the positive trigger voltage Vp. When the level of the input terminal IN transitions from the H to the L, its threshold level becomes the negative trigger voltage Vn. The hysteresis characteristic is thereby implemented.

Even with the configuration and the operation of the circuit described above, a finite time is required for the signal to be transmitted through the inverter INV6 and the input threshold level is then switched. For this reason, when a short-duration noise that inverts the level of the signal at the input terminal IN is input before the switching and the response speed of the driver unit in a subsequent stage is fast, the same malfunction as that of the Schmidt trigger circuit of the latch type occurs.

Even in the Schmidt trigger circuit of such inverter type, by providing the inverter INV4 that can adjust the speed of response to the operating current setting and sensor unit 14 and the driver unit 13, sending of the short pulse signal to the output terminal OUT of the driver unit 13 can be prevented.

As a result, when the Schmidt trigger circuit having the sensitivity adjusting function according to this second embodiment is provided in a stage prior to the circuit for counting the number of pulses, the noise is not counted as the number of the pulses, as in the first embodiment though an increase in counts was caused by the noise in the conventional circuit. Thus, there arises the effect that accurate counting of the number of pulses can be achieved.

In the second embodiment as well, the response speed of the driver unit in the subsequent stage is set as necessary, as in the first embodiment. A mechanism for correcting an error resulting from the temperature variations and variations in the process is provided. The malfunction due to input of the noise can be thereby eliminated.

As seen from the above description, the present invention is effective for preventing the malfunction of most Schmidt trigger circuits in which the method of switching an input level is employed so as to implement the hysteresis characteristic and a finite time is required for the switching.

Further, the present invention is extremely effective in an application in an environment having much noises, in particular, in which accurate measurement of the count of the number of pulses is desired, or the like.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A Schmidt trigger circuit having a sensitivity adjusting function comprising:
   a Schmidt trigger circuit; and
   a buffer circuit having a low-pass filter function of passing a pulse signal with a predetermined width or more, output from said Schmidt trigger circuit;
   the predetermined width being set outside said buffer circuit according to volt-current characteristics of transistors constituting said buffer circuit.

2. The Schmidt trigger circuit having a sensitivity adjusting function according to claim 1, wherein the predetermined width is a minimum pulse width that causes said Schmidt trigger circuit to perform a hysteresis operation.

3. The Schmidt trigger circuit having a sensitivity adjusting function according to claim 1, further comprising:
   an operation setting circuit that sets the predetermined width;
   said operation setting circuit changing a supply voltage and supplying the changed supply voltage to said buffer circuit so as to change the predetermined width.

4. The Schmidt trigger circuit having a sensitivity adjusting function according to claim 3, wherein said operation setting circuit includes a sensor circuit having transistors for setting the supply voltage; and
   said buffer circuit comprises an amplifier circuit constituted from transistors each having a same shape as a corresponding one of said transistors.

5. The Schmidt trigger circuit having a sensitivity adjusting function according to claim 1, wherein said Schmidt trigger circuit comprises:
   a first inverter circuit having a first threshold voltage, and supplying a signal indicating a first level when an input signal is higher than the first threshold voltage;
   a second inverter circuit having a second threshold voltage lower than the first threshold voltage, and supplying a signal indicating a second level when the input signal is lower than the second threshold voltage;
   a logic circuit that does invert (or not invert) an output signal of said first inverter circuit to produce a first logic output signal, and does not invert (or invert) an output signal of said second inverter circuit to produce a second logic output signal; and
   a latch circuit that outputs a signal, a level of the output signal being changed at a point of time when the first logic output signal and the second logic output signal change to the second level (or the first level).

6. The Schmidt trigger circuit having a sensitivity adjusting function according to claim 2, wherein said Schmidt trigger circuit comprises
   a first inverter circuit having a first threshold voltage, and supplying a signal indicating a first level when an input signal is higher than the first threshold voltage;
   a second inverter circuit having a second threshold voltage lower than the first threshold voltage, and supplying a signal indicating a second level when the input signal is lower than the second threshold voltage;
   a logic circuit that does invert (or not invert) an output signal of said first inverter circuit to produce a first logic output signal, and does not invert (or invert) an output signal of said second inverter circuit to produce a second logic output signal; and
   a latch circuit that outputs a signal, a level of the output signal being changed at a point of time when the first logic output signal and the second logic output signal change to the second level (or the first level).

7. A semiconductor device comprising the Schmidt trigger circuit having the sensitivity adjusting function according to claim 1, within a same chip.

8. The semiconductor device according to claim 7, wherein said sensor circuit comprises a first P-ch transistor and a first N-ch transistor, a predetermined current being supplied to a source of said first P-ch transistor, a gate of said first P-ch transistor being connected to a drain of said first P-ch transistor, a source of said first N-ch transistor being grounded, a gate of said first N-ch transistor being connected to a drain of said first N-ch transistor and being also connected to said drain of said first P-ch transistor;

said circuit with the flow-pass filter function comprises a second P-ch transistor and a second N-ch transistor, a predetermined voltage being supplied to a source of said second P-ch transistor, a source of said second N-ch transistor being grounded, a drain of said second N-ch transistor being connected to a drain of said second P-ch transistor to constitute an output terminal, gates of said second P-ch transistor and said second N-ch transistor being common as an input terminal; and a voltage at the source of said first P-ch transistor is supplied to the source of said second P-ch transistor.

9. The semiconductor device according to claim 8, wherein shapes of said first and second P-ch transistors are the same, and shapes of said first and second N-ch transistors are the same.

\* \* \* \* \*